United States Patent [19]

Suzuki

[11] Patent Number: 4,963,737

[45] Date of Patent: Oct. 16, 1990

[54] TRANSMISSION ELECTRON MICROSCOPE

[75] Inventor: Seiichi Suzuki, Tokyo, Japan

[73] Assignee: JEOL Ltd., Tokyo, Japan

[21] Appl. No.: 366,692

[22] Filed: Jun. 15, 1989

[30] Foreign Application Priority Data

Jun. 17, 1988 [JP] Japan ................... 63-149655

[51] Int. Cl.⁵ .............................................. H01J 37/26
[52] U.S. Cl. ............................ 250/311; 250/396 ML;
250/396 R
[58] Field of Search .................. 250/306, 311, 396 R,
250/396 ML, 398

[56] References Cited

U.S. PATENT DOCUMENTS

3,715,582  2/1973  Akahori et al. ................. 250/396 R
4,306,149 12/1981  Lepoole ....................... 250/396 ML
4,429,222  1/1984  Yomezawa ......................... 250/311
4,626,689 12/1986  Tomita et al. .................. 250/396 R
4,633,085 12/1986  Tomita et al. ...................... 250/311

Primary Examiner—Bruce C. Anderson
Attorney, Agent, or Firm—Webb, Burden, Ziesenheim & Webb

[57] ABSTRACT

There is disclosed an electron microscope having an auxiliary lens inserted between the final-stage focusing lens and a set of objective lenses. The microscope is further equipped with a circuit which varies the intensity of the auxiliary lens so as to fix the position of a crossover image irrespective of the intensity of the final-stage focusing lens. The crossover image is created between the auxiliary lens and the set of objective lenses by the auxiliary lens. An aperture plate having an objective aperture is disposed at the fixed position of the crossover image.

9 Claims, 6 Drawing Sheets

TRANSMISSION ELECTRON MICROSCOPE

BACKGROUND OF THE INVENTION

The present invention relates to an improved transmission electron microscope.

In a transmission electron microscope (TEM), an aperture plate having an objective aperture is disposed behind the objective lenses. This plate selects either bright field imaging or dark field imaging.

Figure 1:
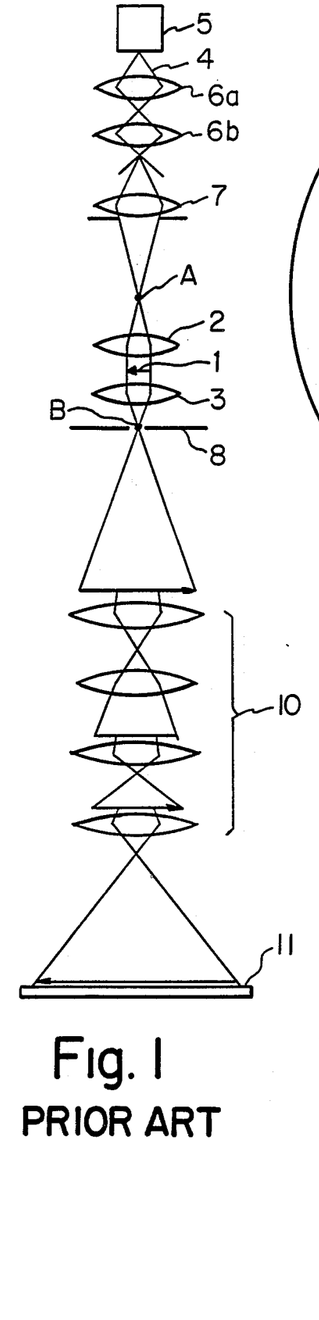
FIG. 1 is a schematic diagram of a conventional transmission electron microscope.

FIG. 1 is a schematic diagram showing the electron beam path in a conventional electron microscope. Optical analogs of the electron lenses are schematically shown in the FIGURE. A specimen 1 to be examined is placed in the magnetic field which is produced by a front objective lens 2 and a rear objective lens 3. The lenses 2 and 3 are disposed, respectively, above and below the specimen 1. The electron beam 4 that is to be directed to the specimen 1 is emitted by an electron gun 5 and diverges. The beam 4 is focused by first, second, and third focusing lenses 6a, 6b, 7, respectively, and the front objective lens 2 in turn. The electron beam transmitted through the specimen 1 passes through an objective aperture formed in a plate 8 and is directed into an imaging lens system 10 containing intermediate lenses.

In FIG. 1, the electron beam 4 is caused by the focusing lens 7 to produce a crossover image A of the beam at a position between the focusing lens 7 and the objective lens 2. Electrons diverging from the crossover image (point A fall on the specimen 1 through the objective lens 2. The electron beam transmitted through the specimen 1 is focused at the position of the aperture plate 8 by the rear objective lens 3, thus creating a crossover image B. The aperture plate 8 is disposed in the back focal plane defined by the rear objective lens 3. After passing through the aperture plate 8, the beam is directed into the imaging lens system 10 which is so set up that the intermediate lenses and other elements together create an electron micrograph on a fluorescent screen 11.

Figure 2:
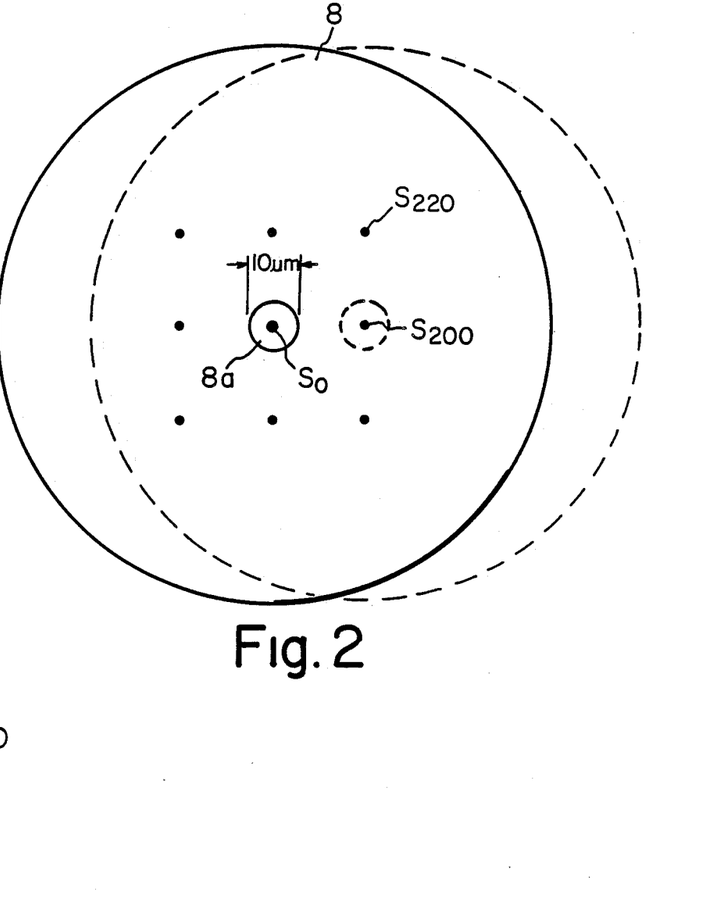
FIG. 2 is a diagram showing a diffraction pattern created on the aperture plate 8 shown in FIG. 1.

A crossover image (diffraction pattern) B as shown in FIG. 2 is formed on the aperture plate 8 having the objective aperture. This diffraction pattern varies, depending on the kind of specimen, but in principle consists of a central spot $S_0$ (a so-called zero order spot) and peripheral spots $S_{200}$, $S_{220}$, etc. The central spot is formed from the electron beam which passed through the specimen without being scattered or diffracted. The peripheral spots are created from the electron beams diffracted toward certain directions by the specimen. When the objective aperture 8a in the aperture plate 8 is aligned with the zero order spot $S_0$ as indicated by the solid line in FIG. 2, then only the electron beam which is neither scattered nor diffracted by the specimen passes through the aperture 8a, creating a bright field image on the fluorescent screen 11. When the aperture 8a is aligned with a desired one of the peripheral spots, such as the spot $S_{200}$ as indicated by the broken line in FIG. 2, only the electron beam diffracted toward a certain direction passes through the aperture 8a. As a result, a dark field image is created on the fluorescent screen 11 under desired diffraction conditions.

In this way, the aperture plate 8 is used to pass only the beam contributing to the formation of a desired spot. Therefore, the aperture plate 8 is required to be disposed correctly on the plane where the crossover image B is formed. Preferably, the diameter of the aperture 8a is so set that the aperture does not reach to any other spot. That is, the desired diameter is approximately between 10 $\mu$m and 20 $\mu$m.

The magnification of a transmission electron microscope can be set at will by changing the intensity of the imaging lens system. In this case, the area of the region of the specimen irradiated with the electron beam is varied according to the magnification. Specifically, the area is narrowed at higher magnifications and enlarged at lower magnifications. The irradiated area is set by the operator by changing the magnitude of the excitation current supplied to the final-stage focusing lens (in the case of the electron microscope shown in FIG. 1, the third focusing lens 7). Since the brightness of the image can be varied by changing the area of the irradiated region, this final-stage focusing lens is normally called the brightness lens.

Figure 3A:
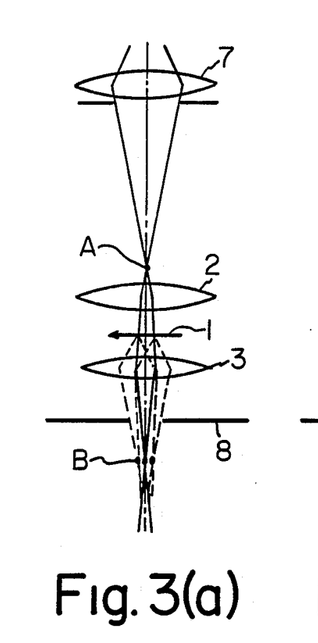
FIGS. 3(a), 3(b), and 3(c) are electron optical diagrams illustrating the manner in which the crossover image B shown in FIG. 1 shifts along the z-axis, or the optical axis of the electron beam.
Figures 3B, 3C:
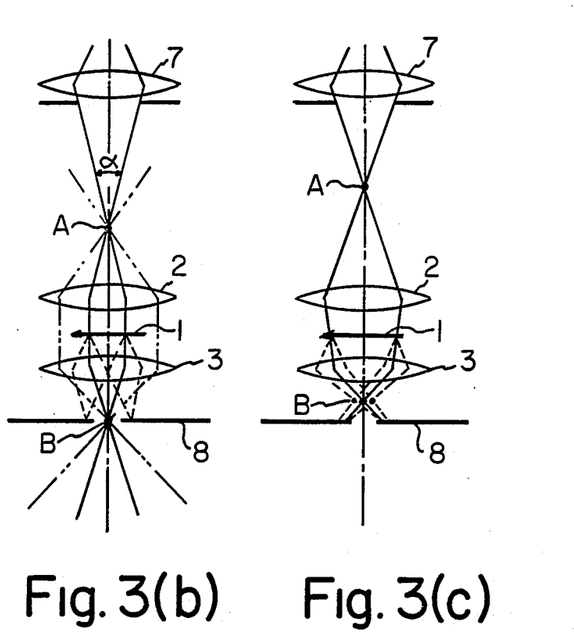

When the area of the irradiated region is changed in this way by adjusting the intensity of the brightness lens 7, the position at which the crossover image is formed is shifted along the z-axis, or the optical axis of the electron beam, by the objective lenses 2 and 3 having constant intensities. The manner of the shift is illustrated in FIGS. 3(a)–3(c), where the magnification is set to a high value, an intermediate value, a low value, respectively. In FIGS. 3(a)–3(c), the broken lines show diffracted electron beams.

Where the position at which the crossover image B is formed coincides with the aperture plate 8 having the objective aperture as shown in FIG. 3(b), only the electron beam forming a desired spot contributes to the formation of an image and so the image is correctly obtained under the desired diffraction conditions. However, where the position at which the crossover image B is formed does not coincide with the aperture plate 8 at high and low magnifications (FIGS. 3(a) and 3(c)), electron beams forming undesired spots pass through the aperture plate 8a and contribute to the formation of the image, as well as the electron beam forming the desired spot. Consequently, the image is not obtained exactly under the desired conditions. In the case shown in FIG. 3(c), the aperture plate 8 excessively limits the field of view.

One conceivable countermeasure is to make the aperture plate 8 movable along the z-axis so that an adjustment is made according to the magnification to maintain the plate 8 at the position at which the crossover image B is formed. However, this scheme cannot be put into practical use because it is difficult to secure space sufficient to install an aperture plate shift mechanism within the present-day electron microscope.

With respect to the unwanted limitation on the field of view, it is considered that the diameter of the aperture 8a is set to a large value of about 50 to 100 $\mu$m. If such a large-sized aperture is used, then plural diffraction spots are situated within the aperture. This makes it impossible to strictly select desired diffraction conditions. Also, the resolution may deteriorate.

These problems also take place where only the intensity of the third focusing lens 7 is adjusted without changing the magnification, for varying the area of the irradiated region.

An electron microscope equipped with an auxiliary lens between a set of objective lenses and a brightness lens is disclosed in U.S. Pat. No. 4,633,085. This auxiliary lens is used to enable the microscope to be switched between the TEM mode and the analysis mode while keeping the correspondence between the specimen positions that are irradiated in the TEM mode and the analysis mode, respectively. Therefore, the known auxiliary lens differs in purpose and form from the novel auxiliary lens.

SUMMARY OF THE INVENTION

It is an object of the present invention to provide a transmission electron microscope in which the crossover image is formed always at the position of the objective aperture plate irrespective of the intensity of the final-stage focusing lens, or the brightness lens, to thereby permit the operator to correctly select diffraction conditions, whereby providing excellent image quality.

It is another object of the invention to provide a transmission electron microscope in which the field of view is prevented from being limited unacceptably even if the diameter of the aperture is reduced down to about 10 to 20 $\mu$m.

In one embodiment of the invention, an auxiliary lens is located between a set of objective lenses and a brightness lens. The intensity of the auxiliary lens is so varied that the crossover image is maintained at the position of the objective aperture plate irrespective of the brightness lens.

Briefly, according to this invention, there is provided a transmission electron microscope (TEM) having an electron gun, a set of objective lenses holding a specimen therein, plural stages of focusing lenses for focusing the electron beam emitted from the electron gun onto the specimen, an aperture plate disposed at the position at which a crossover image is formed by the objective lenses, and an imaging lens system into which the electron beam passed through the aperture plate is introduced. The transmission electron microscope further comprises an analog, digital or computerized circuit means for varying the intensity of the final-stage focusing lens. An auxiliary lens is disposed between the final stage focusing lens and the set of objective lenses. A circuit means 15 is provided for varying the intensity of the auxiliary lens according to the intensity of the final-stage focusing lens to fix the position of the crossover image formed between the auxiliary lens and the set of objective lenses by the auxiliary lens irrespective of the intensity of the final-stage focusing lens.

According to one embodiment, the TEM is provided with a circuit means for reducing the intensity of the auxiliary lens accordingly as the intensity of the focusing lens increases.

According to another embodiment, the TEM further includes a circuit means which varies the intensity of the auxiliary lens independent of the intensities of the other lenses.

According to yet another embodiment, the TEM is provided with circuit means for setting the magnification of the imaging lens system and a circuit means for varying the intensity of the auxiliary lens accordingly as the magnification is changed to fix the position of the crossover image formed between the auxiliary lens and the set of objective lenses. Preferably, the intensity of the auxiliary lens increases as the magnification decreases.

In a most preferred embodiment, the TEM comprises first and second conversion circuit means. The first conversion circuit means varies the intensity of the auxiliary lens according to the intensity of the final-stage focusing lens to fix the position of the crossover image formed between the auxiliary lens and the set of objective lenses by the auxiliary lens irrespective of the intensity of the final-stage focusing lens. The second conversion circuit means varies the intensity of the auxiliary lens according to the magnification set by the magnification-setting means to fix the position of the crossover image formed between the auxiliary lens and the set of objective lenses by the auxiliary lens irrespective of the magnification. A selector switch connects either the first conversion means or the second conversion circuit means to the auxiliary lens.

Other objects and features of the invention will appear in the course of the description thereof which follows.

DESCRIPTION OF THE PREFERRED EMBODIMENTS

Before describing the preferred embodiments of the invention, the manner in which crossover image B is maintained at a fixed position is described. Usually, the intensity of an objective lens is kept constant in use. Therefore, the position at which the crossover image B is formed is uniquely determined by the position at which a crossover image A is formed in front of the objective lens according to the lens equation. This can be easily understood from FIGS. 3(a)-3(c).

Therefore, in order that the crossover image B be fixed at the position of the objective aperture plate, the crossover image A is required to be always formed at the position shown in FIG. 3(b). When the crossover images A and B are fixed at the positions shown in FIG. 3(b), the area of the region of a specimen irradiated with an electron beam is determined uniquely by the divergence angle $\alpha$ of the electron beam forming the crossover image A. This can be readily understood by referring to the beam path indicated by the phantom lines in FIG. 3(b).

Thus, the crossover image A is maintained at the position shown in FIG. 3(b) irrespective of the intensity of the brightness lens. The divergence angle $\alpha$ of the electron beam forming the crossover image A is changed according to the intensity of the brightness lens. The result is that the crossover image B is invariably formed at the position of the objective aperture plate. Also, the size of the irradiated region of the specimen 1 can be set at will.

Figure 4:
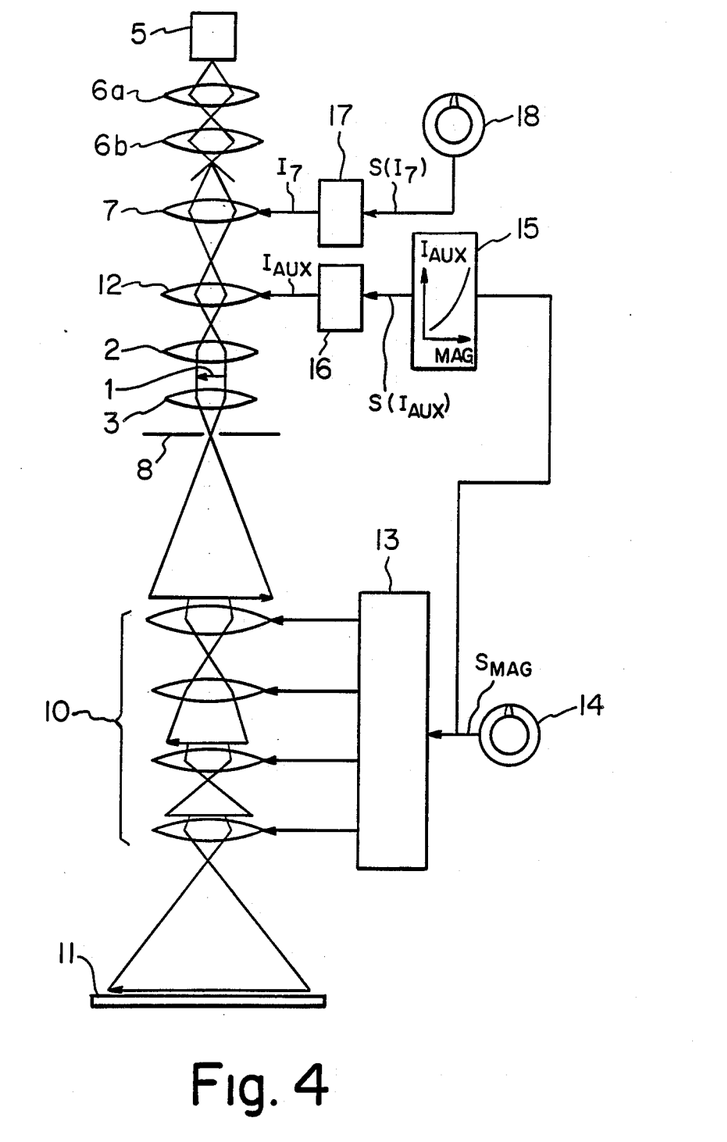
FIG. 4 is a schematic diagram of a transmission electron microscope according to the invention.

FIG. 4 shows one example of the invention based on the above-described theory. The electron optics of this microscope are similar to the electron optical system shown in FIG. 1 except that an auxiliary lens 12 is added. This lens 12 is inserted between the brightness lens 7 and the objective lens 2.

Referring to FIG. 4, an imaging lens system controller 13 supplies excitation currents to the lenses according to a magnification signal $S_{MAG}$ fed from a magnification setting device 14. A conversion circuit 15 converts the magnification signal $S_{MAG}$ into a signal $S(I_{AUX})$ specifying the excitation current fed to the auxiliary lens. This signal $S(I_{AUX})$ is sent to an auxiliary lens driver circuit 16, which supplies an excitation current $I_{AUX}$ to the auxiliary lens 12 according to the signal $S(I_{AUX})$. A brightness lens driver circuit 17 supplies an excitation current $I_7$ to the brightness lens 7 according to a signal $S(I_7)$ from a brightness setting device 18.

In the above-described structure, the imaging lens system controller 13 stores a table indicating the relation between magnification and excitation current for each lens of the imaging lens system. If the human operator specifies a certain magnification, the controller refers to the tables according to the magnification signal $S_{MAG}$ and supplies an excitation current to each lens according to the magnification. The operator adjusts the brightness setting device 18 to set an adequate irradiated specimen region according to the magnification.

Figure 5A:
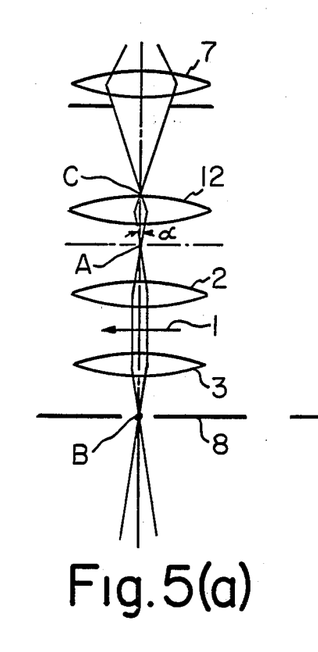
FIGS. 5(a), 5(b), and 5(c) are diagrams showing beam paths around the brightness lens 7, the auxiliary lens 12, the objective lenses 2 and 3 of the microscope shown in FIG. 4 at a high magnification, an intermediate magnification, and a low magnification, respectively.
Figure 5B:
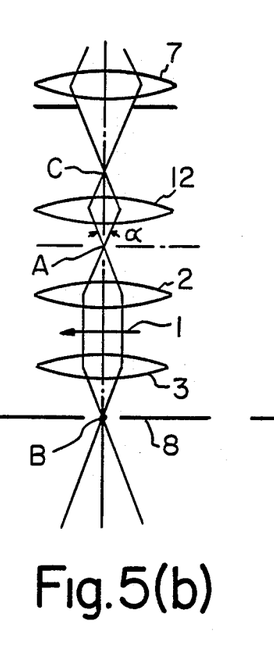
Figure 5C:
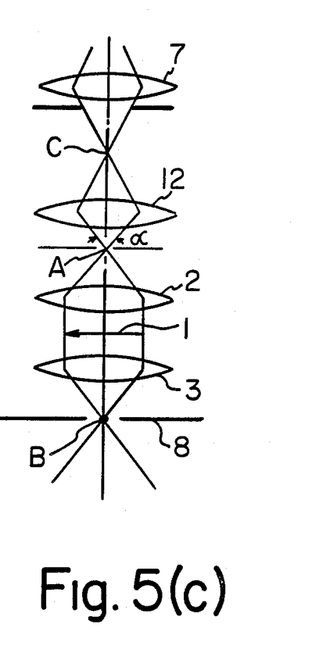
Figure 6:
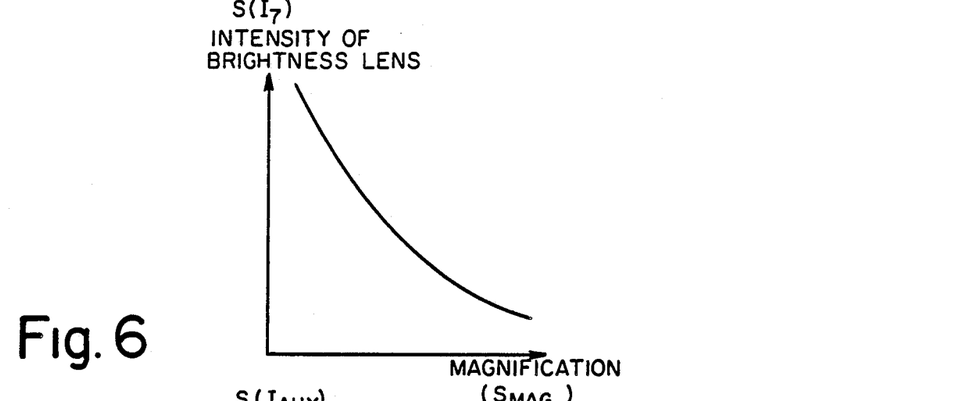
FIG. 6 is a graph showing the relation of the intensity of the brightness lens shown in FIG. 4 to magnification.
Figure 7:
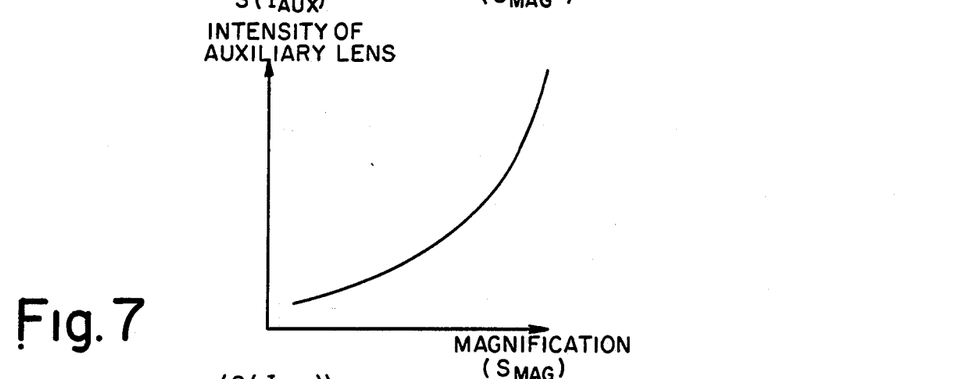
FIG. 7 is a graph showing the relation of the intensity of the auxiliary lens shown in FIG. 4 to magnification.

FIGS. 5(a), 5(b), and 5(c) show the beam paths around the brightness lens 7, the auxiliary lens 12, and the objective lenses 2 and 3 after the operator has adjusted the magnification to a high value, an intermediate value, and a low value, respectively. As can be seen by comparing these Figures, the operator makes an adjustment so that the intensity of the brightness lens 7 increases with decreasing the magnification as shown in FIG. 6. Therefore, a crossover image C created by the brightness lens 7 approaches the brightness lens 7 as the magnification is lowered. On the other hand, the intensity of the auxiliary lens 12 decreases with lowering the magnification as shown in FIG. 7. This function of FIG. 7 is appropriately determined such that the crossover image A created by the auxiliary lens 12 is fixed at a certain position irrespective of the intensity of the brightness lens. Thus, the crossover image B created by the objective lenses 2 and 3 is also maintained at a given position irrespective of the intensity of the brightness lens. The divergence angle α of the electron beam forming the crossover image A varies according to the intensity of the brightness lens 7.

Since the aperture plate 8 is located at the position at which the crossover image B is formed, a diffraction pattern is always formed on the aperture plate 8 independent of the magnification. Therefore, at every magnification, only the electron beam forming the selected, desired spot is allowed to pass through the aperture plate 8 and to contribute to the formation of an image. Consequently, the image is obtained exactly under desired diffraction conditions. Further an aperture having a small diameter of 10 to 20 μm can be used. This prevents the field of view from being limited excessively. Also, there is no possibility of a reduction in the resolution.

In actual configuration, the conversion function of FIG. 7 is stored in the conversion circuit 15 in the form of a table. The conversion circuit 15 converts the signal $S_{MAG}$ specifying the magnification into the signal $S(I_{AUX})$ specifying the auxiliary lens excitation current, utilizing the table. The signal $S(I_{AUX})$ is fed to the auxiliary lens driver circuit 16.

Figure 8:
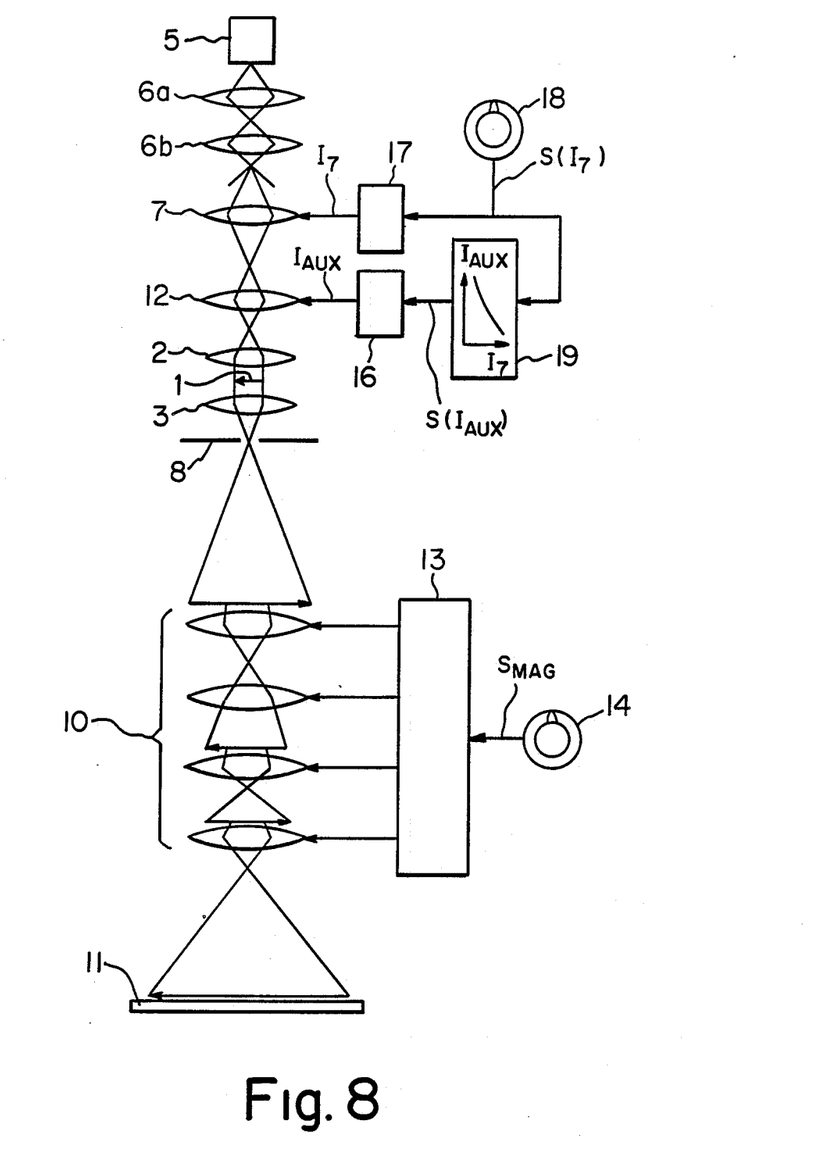
FIG. 8 is a schematic diagram of another transmission electron microscope according to the invention.

In the above description, the excitation current fed to the auxiliary lens is changed according to the magnification signal from the magnification setting device 14. In reality, the brightness lens excitation current sometimes is varied irrespective of the magnification in order to adjust the brightness of the image or to illuminate only the central portion of the image. FIG. 8 shows a transmission electron microscope employed for such a purpose. In FIG. 8, a conversion circuit 19 converts the signal $S(I_7)$ from the brightness setting device 18 into the signal $S(I_{AUX})$ specifying the auxiliary lens excitation current and supplies the signal $S(I_{AUX})$ to the auxiliary lens driver circuit 16.

Figure 9:
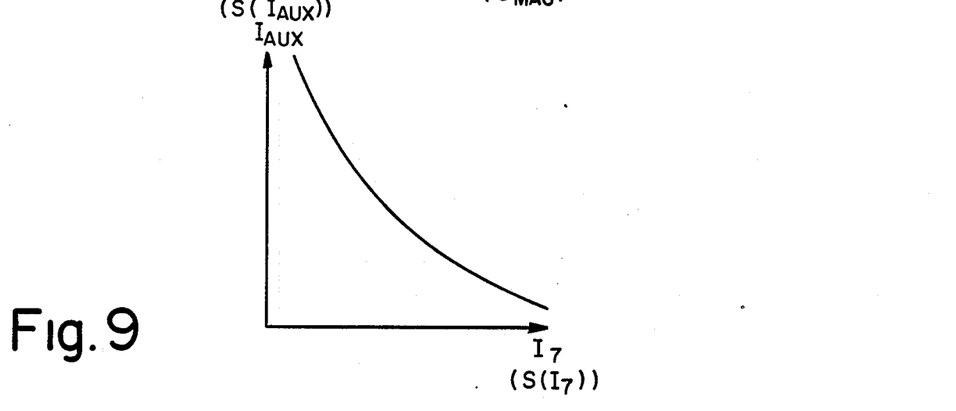
FIG. 9 is a graph showing the relation of the excitation current fed to the auxiliary lens shown in FIG. 8 to the excitation current fed to the brightness lens.

It is now assumed that the imaging lens system is set to a low magnification and that the brightness lens excitation current $I_7$ is reduced by the use of the brightness setting device 18 to switch the excitation of the brightness lens from the condition shown in FIG. 5(c) to the condition shown in FIG. 5(a) or to the condition shown in FIG. 5(b). At this time, only the central portion of the low magnified image on the fluorescent screen 11 is lit up. The auxiliary lens excitation current $I_{AUX}$ is changed by the conversion circuit 19 in such a way that it increases with reducing the brightness lens excitation current $I_7$ as shown in FIG. 9. The function of FIG. 9 is appropriately set to fix the position of the crossover image A created by the auxiliary lens 12, irrespective of the intensity of the brightness lens 7. The function is stored in the conversion circuit 19 in the form of a conversion table. Also in the present example, the crossover image B is formed on the aperture plate 8 by the objective lenses 2 and 3 irrespective of the intensity of the brightness lens. Hence, only the electron beam forming the selected desired spot is allowed to pass through the aperture plate 8 and to contribute to the formation of an image at every intensity of the brightness lens. Thus, the image is obtained exactly under desired diffraction conditions.

Figure 10:
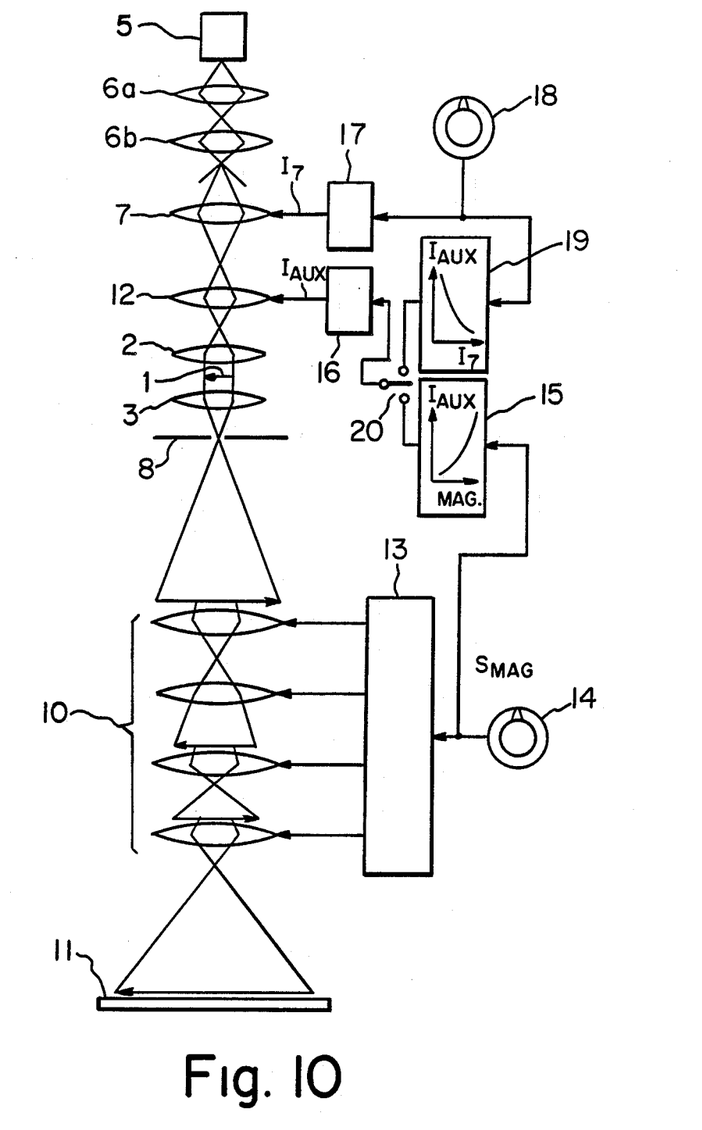
FIG. 10 is a schematic diagram of a further transmission electron microscope according to the invention.

FIG. 10 shows a further transmission electron microscope according to the invention. This microscope is a combination of the microscope shown in FIG. 4 and the microscope shown in FIG. 8. In FIG. 10, a selector switch 20 supplies either the output from a conversion circuit 15 or the output from a conversion circuit 19 to an auxiliary lens driver circuit 16. In this example, therefore, either the mode in which the instrument shown in FIG. 4 operates or the mode in which the instrument shown in FIG. 8 operates can be selected at will.

When the axes of the imaging lens system are aligned, if the image of the objective aperture plate is focused onto the fluorescent screen 11, the aligning operations can be easily performed. In the examples shown in FIGS. 4, 8, and 10, the intensity of the auxiliary lens 12 is changed in step with the magnification or the intensity of the brightness lens 7. In these cases, an image of the specimen is focused onto the fluorescent screen 11 at all times. This makes it difficult to align the axes. Accordingly, it can be thought that only the intensity of the auxiliary lens is rendered variable independently. This makes it possible to focus the image of the objective aperture plate onto the fluorescent screen 11. As a result, the aligning operations are easy to perform.

In the example shown in FIG. 7, the intensity of the auxiliary lens is reduced with decreasing the magnification. In the example shown in FIG. 8, the intensity of the auxiliary lens is increased as the brightness lens excitation current decreases. In special cases, as encountered when an electron beam is accelerated at a low voltage, the intensity of the auxiliary lens may be changed in a manner opposite to the foregoing. That is, the intensity of the auxiliary lens is increased with lowering the magnification. The intensity is reduced with decreasing the auxiliary lens intensity.

While the invention has been described in its preferred embodiments, it is to be understood that various modifications will occur to those skilled in the art without departing from the spirit of the invention. In the above examples, the conversion circuits 15, 19, and the selector switch 20 are individual components. Obviously, the functions of all of these circuit components can be performed by a computer.

Having thus described my invention with the detail and particularity required by the Patent Laws, what is desired and claimed to be protected by Letters Patent is set forth in the following claims.

What is claimed is:

1. A transmission electron microscope having an electron gun, a set of objective lenses holding a specimen therein, plural stages of focusing lenses for focusing the electron beam emitted from the electron gun onto the specimen, an aperture plate disposed at the position at which a crossover image is formed by the objective lenses, and an imaging lens system into which the electron beam passed through the aperture plate is introduced, said transmission electron microscope comprising:
    a means for varying the intensity of the final-stage focusing lens;
    an auxiliary lens disposed between the final-stage focusing lens and the set of objective lenses; and
    a means for varying the intensity of the auxiliary lens according to the intensity of the final-stage focusing lens so constructed and arranged that the position of the crossover image formed between the auxiliary lens and the set of objective lenses by the auxiliary lens can be fixed irrespective of the intensity of the final-stage focusing lens.

2. The transmission electron microscope of claim 1, wherein said means for varying the intensity of the auxiliary lens according to the intensity of the focusing lens increases the intensity of the auxiliary lens with reducing the intensity of the focusing lens.

3. The transmission electron microscope of claim 1, further including a means which varies the intensity of the auxiliary lens independent of the intensities of the other lenses.

4. A transmission electron microscope having an electron gun, a set of objective lenses holding a specimen therein, plural stages of focusing lenses for focusing the electron beam emitted from the electron gun onto the specimen, an aperture plate disposed at the position at which a crossover image is formed by the objective lenses, and an imaging lens system into which the electron beam passed through the aperture plate is introduced, said transmission electron microscope comprising:
    a means for varying the intensity of the final-stage focusing lens;
    a means for setting the magnification of the imaging lens system;
    an auxiliary lens disposed between the final-stage focusing lens and the set of objective lenses; and
    a means for varying the intensity of the auxiliary lens according to the magnification set by the magnification-setting means so constructed and arranged that the position of the crossover image formed between the auxiliary lens and the set of objective lenses by the auxiliary lens can be fixed irrespective of the magnification.

5. The transmission electron microscope of claim 4, wherein said means for varying the intensity of the auxiliary lens according to the magnification increases the intensity of the auxiliary lens with decreasing the magnification.

6. The transmission electron microscope of claim 4, further including a means which varies the intensity of the auxiliary lens independent of the intensities of the other lenses.

7. A transmission electron microscope having an electron gun, a set of objective lenses holding a specimen therein, plural stages of focusing lenses for focusing the electron beam emitted from the electron gun onto the specimen, an aperture plate disposed at the position at which a crossover image is formed by the objective lenses, and an imaging lens system into which the electron beam passed through the aperture plate is introduced, said transmission electron microscope comprising:
    a means for varying the intensity of the final-stage focusing lens;
    a means for setting the magnification of the imaging lens system;
    an auxiliary lens disposed between the final-stage focusing lens and the set of objective lenses;
    a first conversion means for varying the intensity of the auxiliary lens according to the intensity of the final-stage focusing lens so constructed and arranged that the position of the crossover image formed between the auxiliary lens and the set of objective lenses by the auxiliary lens can be fixed irrespective of the intensity of the final-stage focusing lens;
    a second conversion means for varying the intensity of the auxiliary lens according to the magnification set by the magnification-setting means so constructed and arranged that the position of the crossover image formed between the auxiliary lens and the set of objective lenses by the auxiliary lens can be fixed irrespective of the magnification; and
    a selector means which connects either the first conversion means or the second conversion means to the auxiliary lens.

8. The transmission electron microscope of claim 7, wherein said first conversion means increases the intensity of the auxiliary lens with reducing the intensity of the focusing lens.

9. The transmission electron microscope of claim 7, wherein said second conversion means increases the intensity of the auxiliary lens with reducing the magnification.

* * * * *